US011973114B2

(12) United States Patent
Cooper

(10) Patent No.: US 11,973,114 B2
(45) Date of Patent: Apr. 30, 2024

(54) MOS-BASED POWER SEMICONDUCTOR DEVICE HAVING INCREASED CURRENT CARRYING AREA AND METHOD OF FABRICATING SAME

(71) Applicant: Purdue Research Foundation, West Lafayette, IN (US)

(72) Inventor: James A. Cooper, Santa Fe, NM (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 17/499,579

(22) Filed: Oct. 12, 2021

(65) Prior Publication Data

US 2022/0109050 A1  Apr. 7, 2022

Related U.S. Application Data

(63) Continuation of application No. 16/557,731, filed on Aug. 30, 2019, now Pat. No. 11,145,721, which is a
(Continued)

(51) Int. Cl.
*H01L 29/10* (2006.01)
*H01L 29/06* (2006.01)
(Continued)

(52) U.S. Cl.
CPC ...... *H01L 29/1037* (2013.01); *H01L 29/1095* (2013.01); *H01L 29/1608* (2013.01); *H01L 29/4916* (2013.01); *H01L 29/66681* (2013.01); *H01L 29/66795* (2013.01); *H01L 29/7802* (2013.01); *H01L 29/7803* (2013.01);
(Continued)

(58) Field of Classification Search
CPC .......... H01L 29/7835; H01L 29/66795; H01L 29/785
See application file for complete search history.

(56) References Cited

U.S. PATENT DOCUMENTS 5,068,700 A   11/1991  Yamaguchi
5,804,483 A    9/1998  Harris
(Continued)

FOREIGN PATENT DOCUMENTS

JP   2010-067670 A   3/2010

OTHER PUBLICATIONS

PCT/US2014/015609 International Search Report and Written Opinion, dated Jun. 27, 2014.

*Primary Examiner* — Bilkis Jahan
*Assistant Examiner* — Victor V Barzykin
(74) *Attorney, Agent, or Firm* — Maginot, Moore & Beck LLP

(57) ABSTRACT

A semiconductor device includes at least a first lateral MOSFET formed on a semiconductor substrate. The first lateral MOSFET has an interface defined by a plurality of trenches along which the current flow can be modulated by a perpendicular electric field. The portion of the interface lies on a plane substantially perpendicular to the plane of the substrate. The interface is configured such that at least a portion of the current flow along the portion of the interface that lies on a plane substantially perpendicular to the plane of the substrate is in a direction substantially parallel to the plane of the substrate.

15 Claims, 13 Drawing Sheets

Related U.S. Application Data continuation of application No. 16/006,571, filed on Jun. 12, 2018, now Pat. No. 10,403,720, which is a continuation of application No. 15/027,629, filed as application No. PCT/US2014/015609 on Feb. 10, 2014, now Pat. No. 9,997,599.

(60) Provisional application No. 61/887,485, filed on Oct. 7, 2013.

(51) Int. Cl.
  *H01L 29/08* (2006.01)
  *H01L 29/16* (2006.01)
  *H01L 29/49* (2006.01)
  *H01L 29/66* (2006.01)
  *H01L 29/739* (2006.01)
  *H01L 29/78* (2006.01)

(52) U.S. Cl.
  CPC ........ *H01L 29/7835* (2013.01); *H01L 29/785* (2013.01); *H01L 29/0696* (2013.01); *H01L 29/0865* (2013.01); *H01L 29/7395* (2013.01)

(56) References Cited

U.S. PATENT DOCUMENTS

| | | | |
|---|---|---|---|
| 6,303,410 | B1 | 10/2001 | Baliga |
| 7,242,058 | B2 * | 7/2007 | Risaki ................ H01L 29/0657 |
| | | | 257/E29.066 |
| 8,236,648 | B2 * | 8/2012 | Hashitani .......... H01L 29/66621 |
| | | | 438/389 |
| 2006/0202305 | A1 | 9/2006 | Hueting |
| 2006/0223253 | A1 * | 10/2006 | Risaki ................ H01L 29/7825 |
| | | | 257/E21.429 |
| 2011/0133205 | A1 | 6/2011 | Nagahisa |
| 2012/0012860 | A1 | 1/2012 | Miyahara |
| 2012/0187476 | A1 * | 7/2012 | Risaki ................ H01L 29/7834 |
| | | | 438/270 |
| 2012/0256238 | A1 | 10/2012 | Ning |
| 2013/0062692 | A1 * | 3/2013 | Chen .................. H01L 29/0653 |
| | | | 257/E29.256 |
| 2015/0008448 | A1 | 1/2015 | Bolotnikov |

\* cited by examiner

MOS-BASED POWER SEMICONDUCTOR DEVICE HAVING INCREASED CURRENT CARRYING AREA AND METHOD OF FABRICATING SAME

This application is a continuation of U.S. patent application Ser. No. 16/557,731, filed Aug. 30, 2019, which is a continuation of U.S. patent application Ser. No. 16/006,571, filed Jun. 12, 2018, issued as U.S. Pat. No. 10,403,720, which is a continuation of U.S. patent application Ser. No. 15/027,629, filed Apr. 6, 2016, issued as U.S. Pat. No. 9,997,599, which is a 371 of International Application No. PCT/US2014/015609, filed Feb. 10, 2014, which claims the benefit of U.S. Provisional Application Ser. No. 61/887,485, filed Oct. 7, 2013, which is incorporated herein by reference.

FIELD OF THE INVENTION

The present invention relates generally to power semiconductor devices, and in particular, to power MOSFETs and other MOS-based power switching devices, as well as other forms of power switching devices that utilize MOS-based, JFET-based, and MESFET-based control elements.

BACKGROUND OF THE INVENTION

Advances have been made in metal oxide semiconductor field effect transistors (MOSFETs). One design consideration is the on-resistance of the transistor as compared to the area of the device.

FIG. 2 shows a top-view photograph of an array 10 of cells 12 of a prior art silicon carbide SiC double-implanted MOSFET (DMOSFET). More specifically, the array includes a plurality of interdigitated source fingers 14 and gate fingers 16. FIG. 1 shows a schematic cross-sectional view of a cell 12 (and part of another cell) of the array 10 including one gate finger 16 and parts of two source fingers 14. As shown in FIG. 1a, the DMOSFET cell 12 includes a drain contact layer, e.g., a nickel layer 20, a substrate 22, a drift region 24, a base region 26, a source region 28, a source contact 30, a conductive gate 32, a gate insulator 34, and a top contact layer 36.

The substrate 22 is an SiC substrate of a first dopant type (N+) having a high dopant concentration. The drift region 24 is also of the first dopant type, but has a lower dopant concentration (N−), less than the first high concentration. The base region 26 comprises implanted wells of a second dopant type, e.g., a P− base. The source regions 28 are also of the first dopant type and have a high concentration, e.g., N+ source regions. The gate finger 16 defines a gate region that includes the gate insulator 34, which may be an oxide region, and the conductive gate 32, which may suitably be a polysilicon gate. The top metal contact layer 36 directly abuts the source contact 30 and the gate insulator 34. The top metal contact layer 36 provides an electrical connection to the source contact 30. The top metal contact layer 36 is electrically insulated from the gate 32 by the gate insulator 34.

In operation, when a voltage is applied to the gate conductor 32, an inversion layer is formed near the top of the p-base region 26, and an n-type accumulation layer is formed near the top of the drift region 24. As a result current flows between the source and draining via the source region, the inversion layer in the P-base region 26, the drift region 24, and the semiconductor substrate 22.

While only one portion of the DMOSFET is shown in FIG. 1a, it is understood that these portions duplicate in a repeated fashion, as shown in FIG. 2.

One performance metric for power MOSFETs is the specific on-resistance, defined as the product of device area and device resistance in the linear region. Several factors contribute to the specific on-resistance, but the most important are (i) channel resistance, (ii) source resistance, (iii) JFET resistance (i.e. resistance of the portion of the drift region that lies between the P base regions), (iv) drift region resistance, and (v) drain resistance.

While the above design provides for relatively advantageous on-resistance characteristics, new designs are needed to lessen resistance-area product of a MOS devices by reducing on-resistance, device area, or both.

SUMMARY OF THE INVENTION

It is an objective of device design to reduce both the on-resistance and the device area simultaneously so as to achieve the minimum resistance-area product. At least some embodiments of the present invention address the above-stated needs, as well as others, by providing a MOSFET design in which at least some portion of the channel related areas have increased surface area through the use of lateral trenches having side walls and bottom walls that run parallel with current flow through the channel.

A first embodiment is a semiconductor device that includes at least a first lateral MOSFET formed on a semiconductor substrate. The first lateral MOSFET has an interface defined by a plurality of trenches along which the current flow can be modulated by a perpendicular electric field. The portion of the interface lies on a plane substantially perpendicular to the plane of the substrate. The interface is configured such that at least a portion of the current flow along the portion of the interface that lies on a plane substantially perpendicular to the plane of the substrate is in a direction substantially parallel to the plane of the substrate.

A corresponding method for fabricating a semiconductor device includes forming first and second spaced apart base regions and source regions in a substrate with a portion of a drift region therebetween. The method further includes forming at least a first trench extending laterally through the base region, the drift region and the source region, the first trench extending vertically partially through the source region. The method also includes forming a first oxide layer over the trenched upper surface, and forming a polysilicon layer over the first oxide layer. The polysilicon layer is patterned to form the gate conductor, and a drain contact is formed on a bottom surface of the semiconductor substrate.

The above described features and advantages, as well as others, will become more readily apparent to those of ordinary skill in the art by reference to the following detailed description and the accompanying drawings.

BRIEF DESCRIPTION OF THE DRAWINGS

FIG. 1011 shows the substrate of FIG. 10F after a light etching removes an oxide layer;

DETAILED DESCRIPTION

Figure 2:
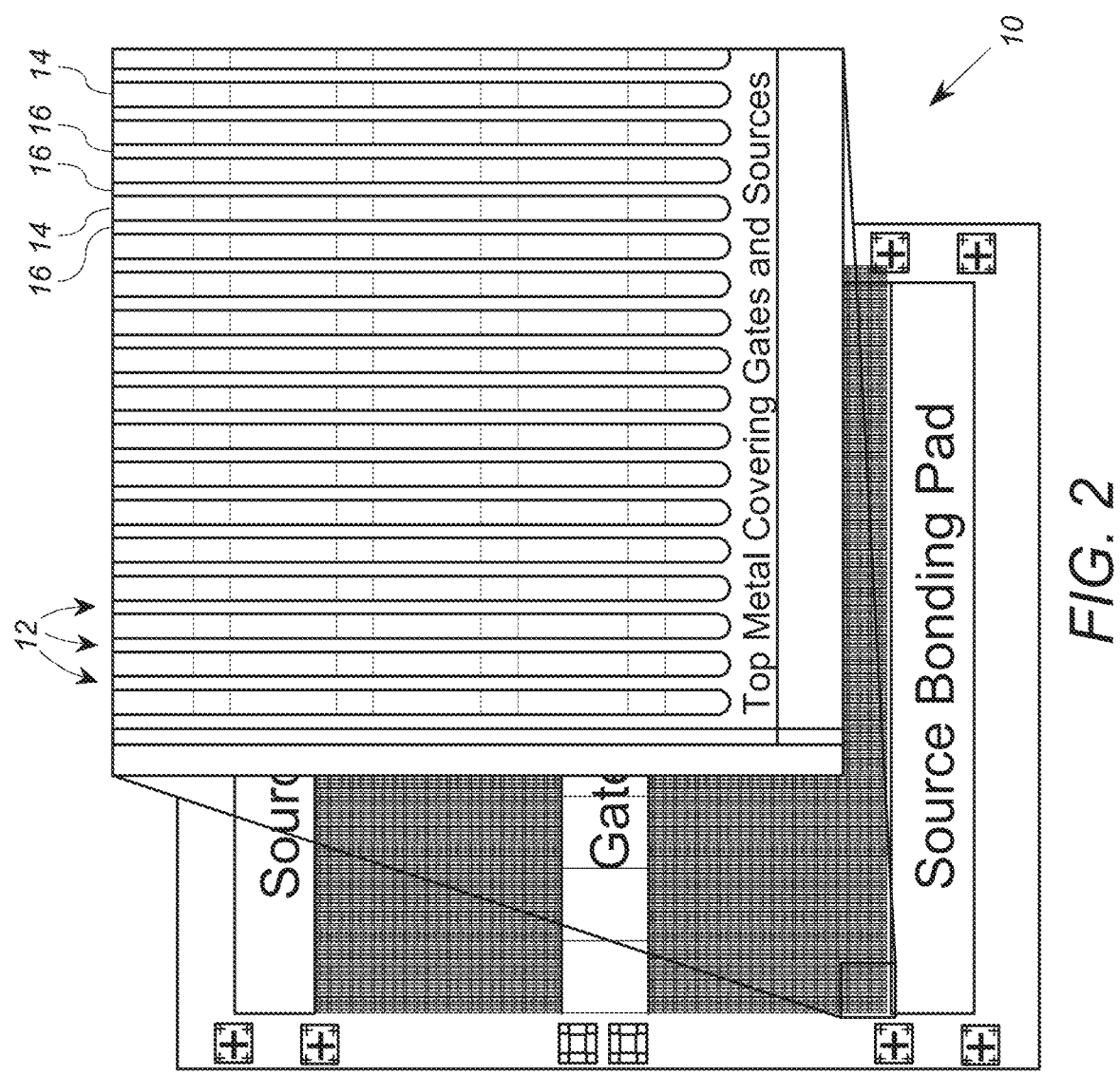
FIG. 2 shows a top-view photograph of the prior art DMOSFET of FIG. 1.
Figure 3:
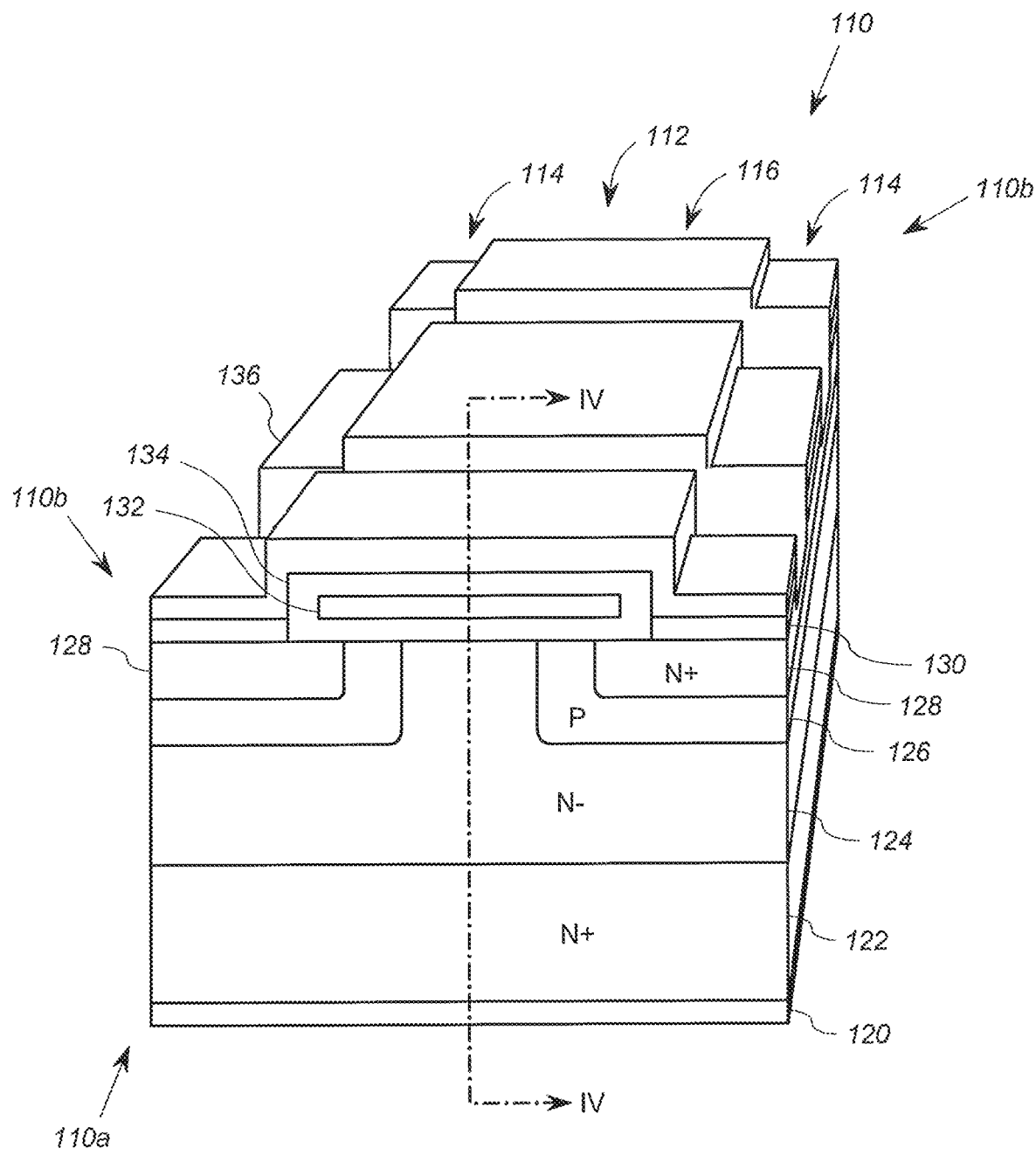
FIG. 3 shows a schematic cross-sectional view of an exemplary cell (and part of another cell) of a DMOSFET device that implements a first embodiment of the invention.

FIG. 3 shows a schematic cross-sectional view of an exemplary cell 112 (and part of another cell) of a DMOSFET device 110 that implements a first embodiment of the invention. The cell 112 shown in FIG. 3 includes one gate finger 116 and parts of two source fingers 114. The device 110 preferably includes several interdigitated gate fingers and source fingers of the same design. In other words, the device 110 may suitably have a general layout similar to that of the prior art device of FIG. 2, wherein the array includes a plurality of interdigitated gate fingers 116 and source fingers 114. The DMOSFET cell 110 includes a drain contact layer 120, a semiconductor substrate 122, a drift region 124, a base region 126, a source region 128, a source contact 130, a conductive gate 132, a gate insulator 134, and a top contact layer 136. The cell 112 and the semiconductor device 110 have a first surface 110a (bottom) and a vertically opposite second surface 110b (top).

The semiconductor substrate 122 extends upward from the first surface 110a and is doped with a first dopant type at a first concentration. In this embodiment, the first dopant type is an N dopant type, and a second dopant type is a P dopant type. However, it will be appreciated that the first and second dopant types in other embodiments can be reversed, such that the P dopant type is the first dopant type and the N dopant type is the second dopant type. In this embodiment, the first concentration of the first dopant type (N) is a relatively high concentration, symbolized by the N+ designation. The substrate 122 in this embodiment is an SiC substrate. However, it will be appreciated that in other embodiments, other substrate materials may be used, such as silicon, GaAs, GaN, and other elemental and compound semiconductors.

The drift region 124 is disposed above the semiconductor substrate 122. The drift region 124 is doped with the first dopant type at a second concentration, wherein the second concentration less than the first concentration. In other words, the drift region 124 is more lightly doped than the semiconductor substrate 122, and is characterized in this embodiment as an N-doping. The drift region 124 extends upward in this embodiment from the substrate 122, and has a topology at the top defined at least in part by the source region 128 and base region 126. A portion of the drift region 124 extends to or adjacent to the top surface 110b of the device 110. In some embodiments, a more strongly doped, thin, N epilayer is also formed at the top of the drift region 124.

FIG. 3 shows parts of two source regions 128 from adjacent transistor cells. Each source region 128 is doped with the first dopant type at a third concentration. The third concentration may also be relatively high, designated also as an N+ region in this embodiment. Each source region 128 is positioned over a portion of the drift region 124, and beside the portion of the drift region 124 that extends to near the top surface 110b. The source region 128 also extends to near the top surface 110b.

Each base region 126 is disposed between the source region 128 and the drift region 124. The base region 126 is doped with the second dopant type, which in the embodiment described herein in a P-type doping. Although not shown in FIG. 3, the base region 126 includes at least one trench having at least a first vertical wall and at least a first horizontal wall, and is configured to conduct current in a horizontal direction on the first vertical wall and in a horizontal direction on the first horizontal wall. In this embodiment, as will be discussed below, the at least one trench further extends into and through the source region 128 and the drift region 124.

The gate insulator 134 and the gate conductor 132 form a gate region disposed above the drift region 124, above a portion of the base region 126, and above a portion of the source regions 128. The gate conductor 132 may be formed of any suitable conductor, and in this embodiment is formed of polysilicon. The gate conductor 132 is separated from the drift region 124, the base region 126, and the source region 128 by the gate insulator 134. The gate insulator 134 may suitably be an oxide.

The drain contact 120 is a conductive material, such as a metallization layer, coupled to the semiconductor substrate 122 at the first surface 110a. In the embodiment employing an N+ SiC substrate 122, the drain contact may suitably be made of Ni. Other materials may be used, particularly with other substrates.

Each base region 126 forms a further region disposed between the source region 128 and the drift region 124. Although not shown in FIG. 3, the base region 126 includes at least one trench having at least a first vertical wall and at least a first horizontal wall, and is configured to conduct current in a horizontal direction on the first vertical wall and in a horizontal direction on the first horizontal wall. In this embodiment, as will be discussed below, the at least one trench further extends into and through the source region 128 and the drift region 124.

Figure 4:
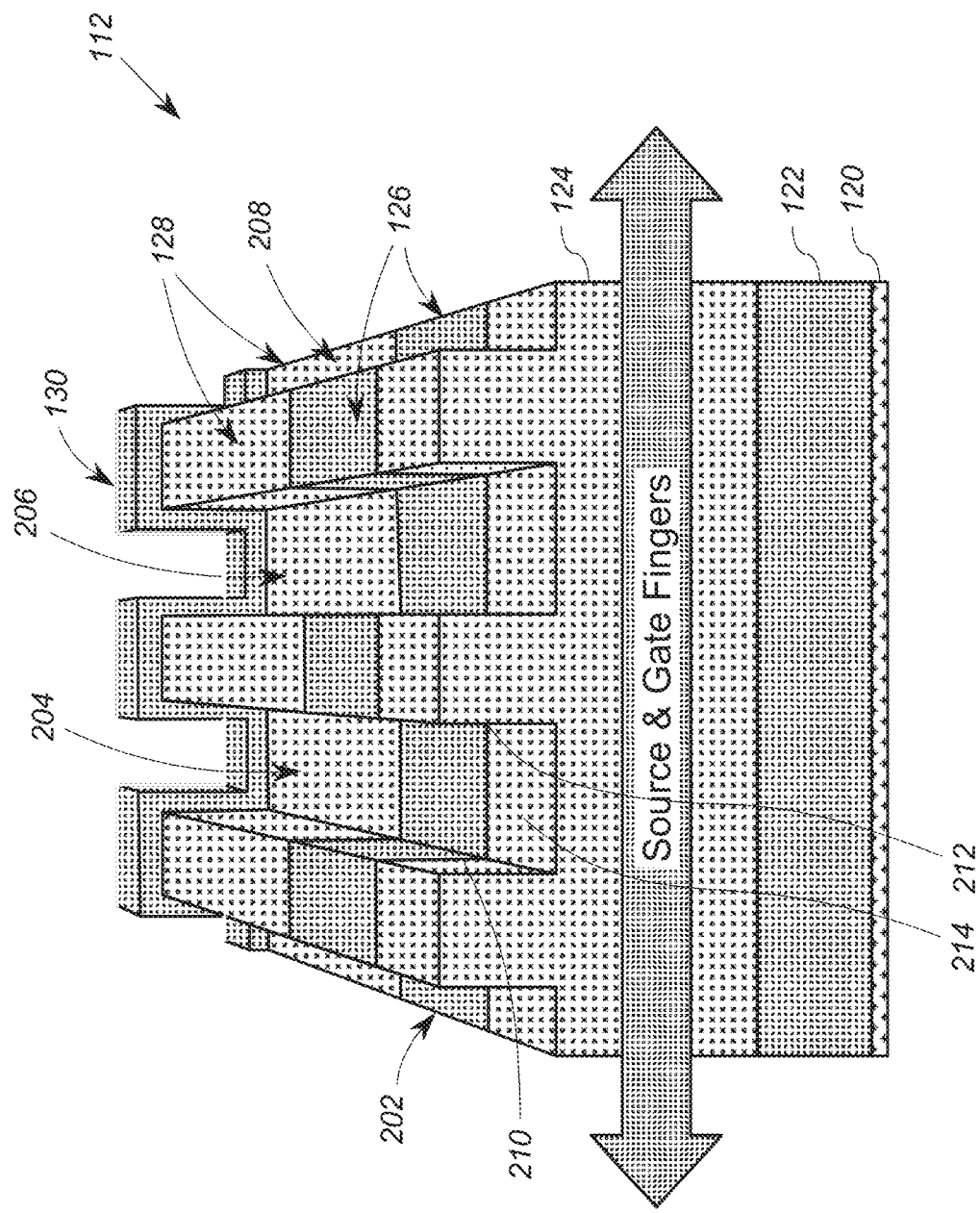
FIG. 4 shows a cutaway perspective side view of a portion of the device of FIG. 3 taken along line Iv-Iv with the gate conductor, gate insulator and top contact layer removed for clarity of exposition.

FIG. 4 shows a cutaway perspective side view of a portion of the device of FIG. 3 taken along line IV-IV. In FIG. 4, the gate conductor 132, gate insulator 134 and top contact layer 136 have been removed for clarity of exposition.

As shown in FIG. 4, the cell 112 includes a plurality of trenches 202, 204, 206, 208 formed horizontally, but in a directly transverse to the source fingers 114 and gate fingers 116. The trench 204 includes two vertical walls 210, 212 and a bottom horizontal wall 214 extending therebetween. The vertical walls 210, 212 and the horizontal wall 214 extend in a horizontal direction proximate to and along the top surface 110b of the device 110 through the uppermost portions of the drift region 124, the base 126 and the source region 128.

Figure 5:
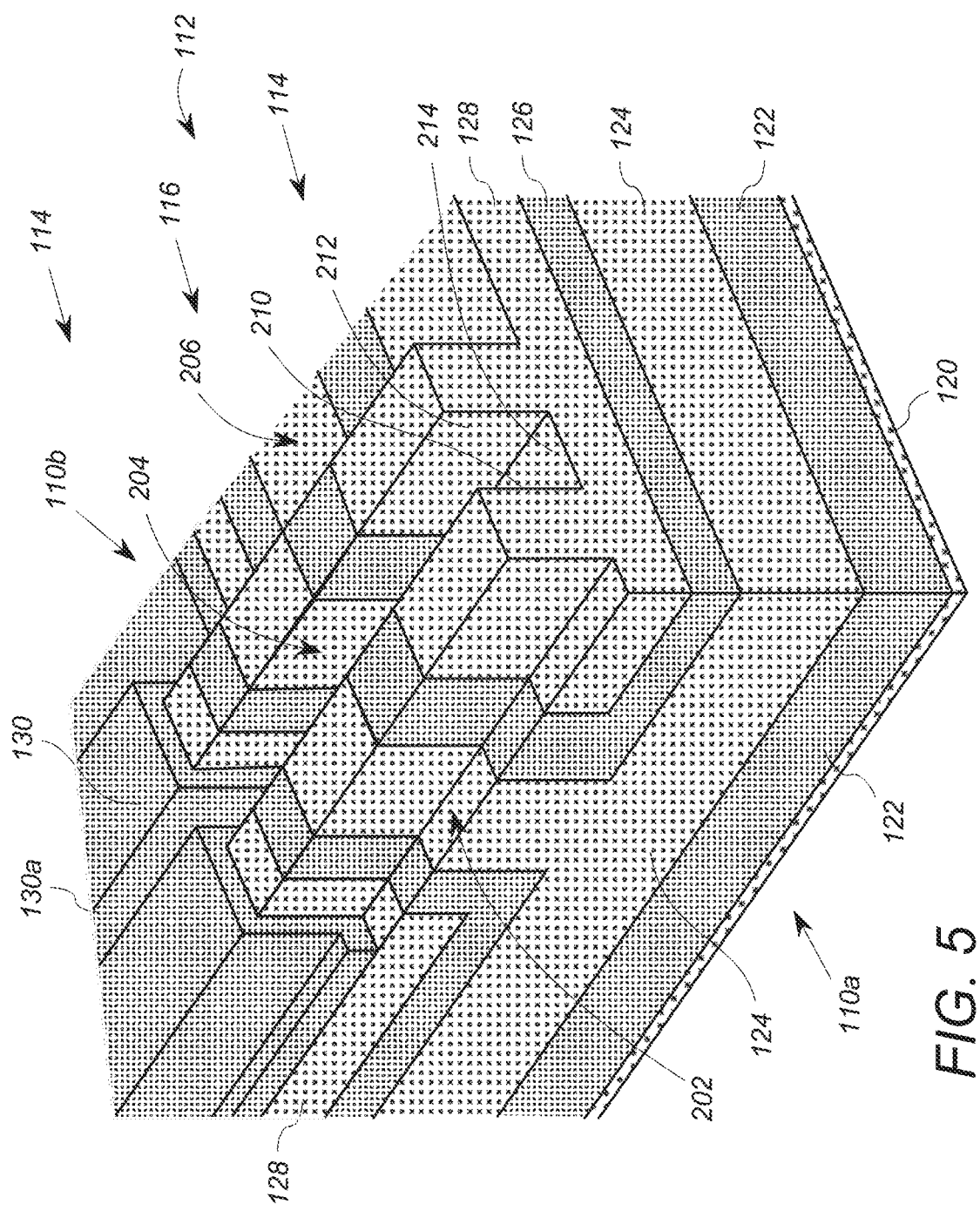
FIG. 5 shows a fragmentary, cutaway, perspective view of the cell of FIGS. 3 and 4 with the gate conductor, gate insulator and top contact layer removed for clarity of exposition.

FIG. 5 shows another fragmentary, cutaway, perspective view of the cell 112 of FIGS. 3 and 4 with the gate conductor 132, gate insulator 134 and top contact layer 136 also removed for clarity of exposition. The view of the cell in FIG. 5 shows both of the base regions 126 and source regions 128, and the portion of the drift region 124 that extends to or near the top surface 110b of the device 110. As shown in FIG. 5, the trenches 202, 204, and so forth extend through the drift region 124 and are therefore continuous through multiple cells 112 of the device 110. These trenches 202, 204 run perpendicular to the direction of the source fingers 114 and the gate fingers 116.

Figure 6:
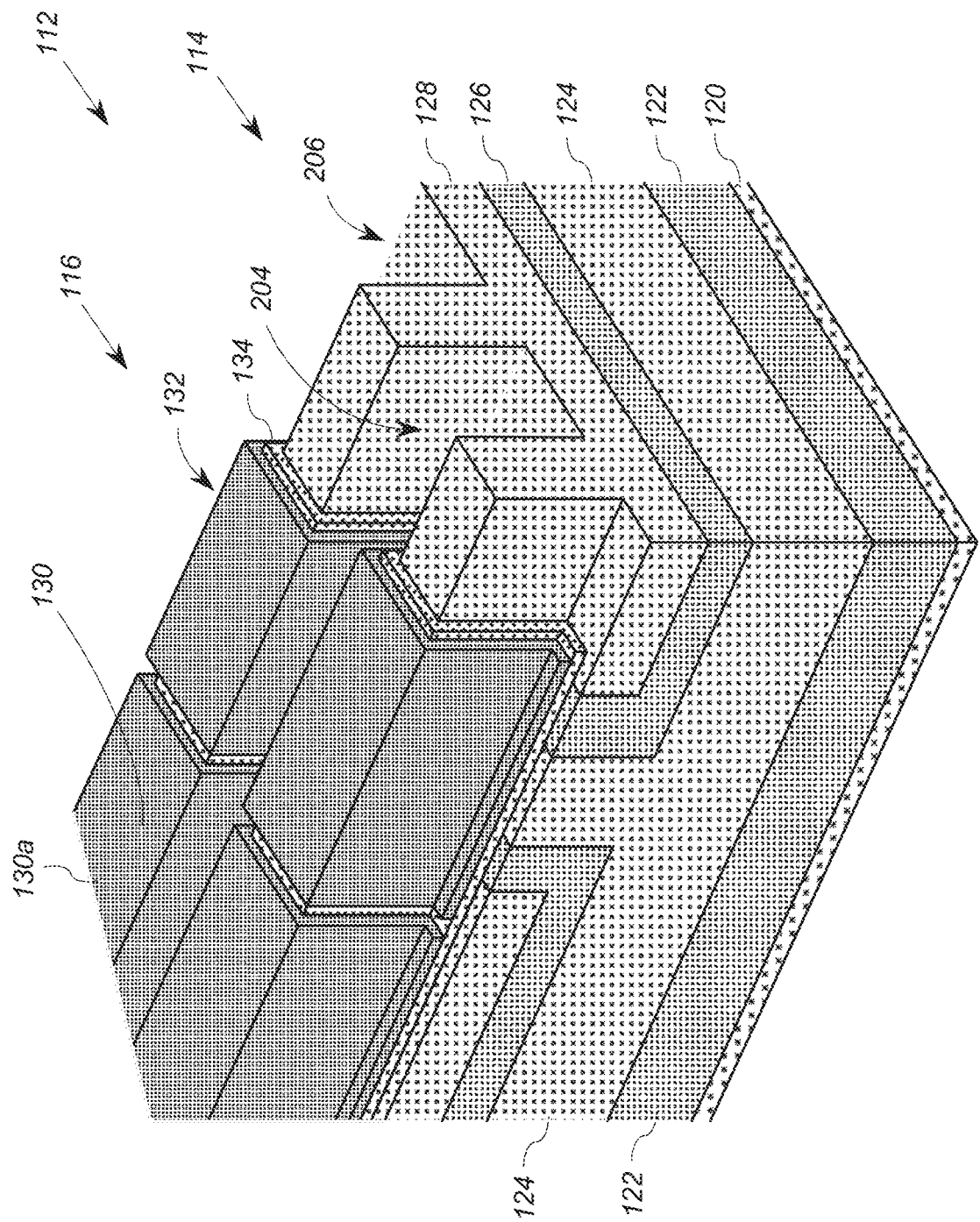
FIG. 6 shows another fragmentary, cutaway, perspective view of the cell of FIGS. 3 and 4 with the gate conductor and portions of the gate insulator thereof. The entire gate insulator is not shown for clarity of exposition.

FIG. 6 shows yet another cutaway, perspective view of the cell 112 similar to FIG. 5, but with the gate conductor 132 and portions of the gate insulator 134 added back in. As shown in FIG. 6, at least the gate conductor 132 has a shape that conforms to the trenches 202, 204, 206. The bottom of the gate insulator 134 also conforms to the trenches 202, 204, 206, as does the bottom of the source contact 130. The tops of the gate insulator 134 and source contact 130 may or may not conform to the trench shape. As shown in FIGS. 4-6, the source contact 130 may suitably have a flat top surface 130a.

In operation, when a voltage is applied to the gate conductor 132, an inversion layer is formed near the top of the p-base region 126 on both the vertical walls (e.g. 210, 212) and the horizontal (bottom) walls (e.g. 214) of the trenches 202, 204, 206 extending therethrough, as well as through the portion of the p-base regions 126 (near or at the top surface 110b) between adjacent trenches 202, 204 and 206. Similarly, an n-type accumulation layer is formed on or near the vertical walls 210, 212 and horizontal walls 214 of the trenches 202, 204, 206 in the drift region 124, as well as through the portions of drift region 124 near or at the top surface 110b that are between adjacent trenches 202, 204 and 206. As a result, a horizontal current path 220 is formed between the source region 128 and the top part of the drift region 124 through the base region 126 via the vertical side walls 210, 212, the horizontal walls 214, and the top surface area between, the trenches 202, 204, and so forth.

Charge carriers, electrons in this embodiment, flow through this horizontal current path from the source to the drain via source region 128, the inversion layer in the p-base region 126, the drift region 124, and through the semiconductor substrate 122 to the drain contact 120. The flow of charge carriers constitutes the current flow in the device 110. Thus, the current flows in the same horizontal current path, but from source to drain since the charge carriers are electrons in this embodiment.

Figure 7:
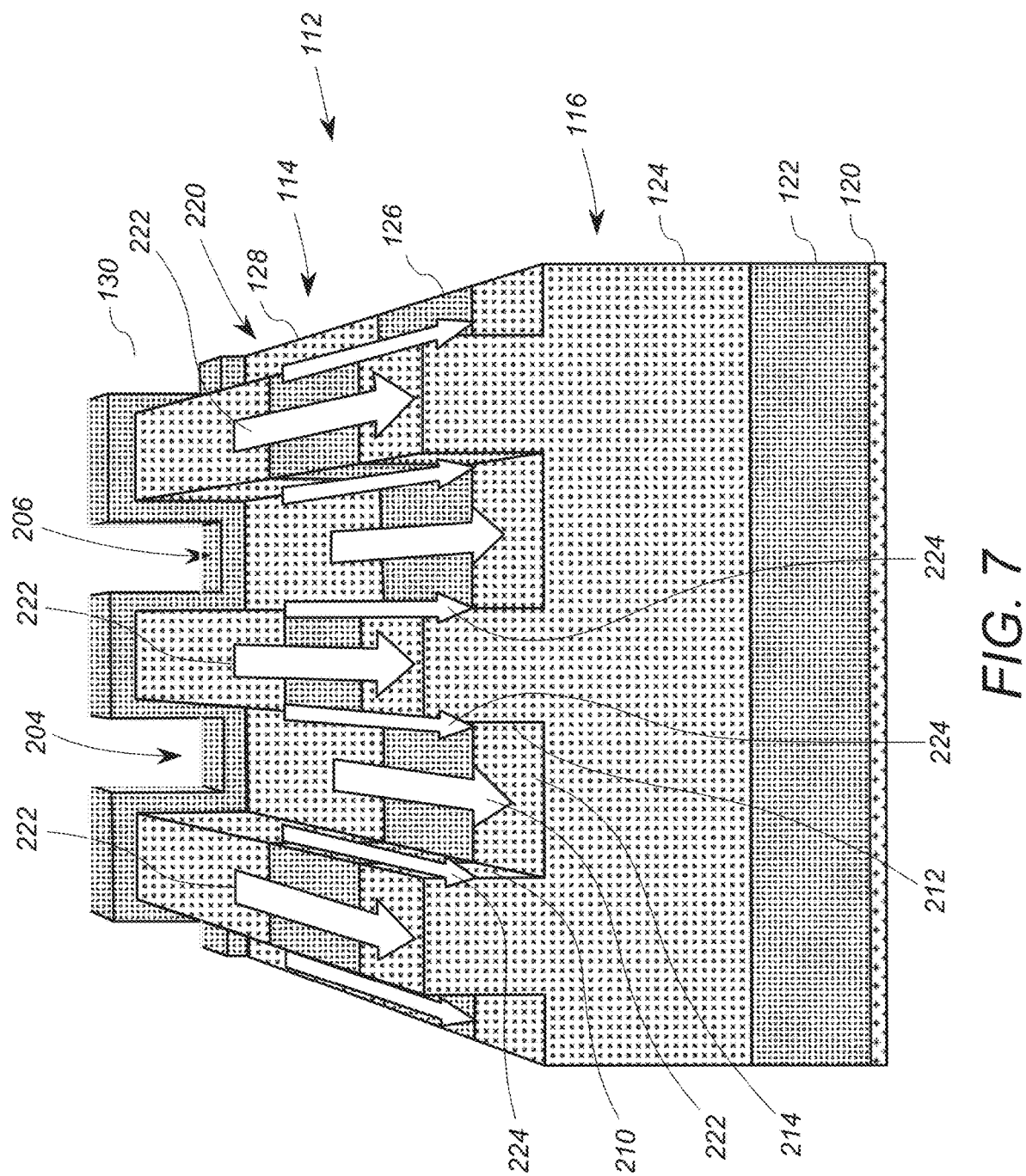
FIG. 7 shows a cutaway view of the cell of FIG. 3 showing current paths including horizontal wall paths and vertical wall paths.

Thus, the device 110 of FIGS. 3-6 forms a three-dimensional-gate (3G) arrangement in which vertical trenches 202, 204, 206 are formed perpendicular to the gate and source fingers 114, 116, as shown in FIGS. 3-6. These trenches 202, 204, 206 expose sidewall (vertical wall) faces as well as horizontal faces, without increasing cell area. This arrangement increases the effective channel width by 2-3 times, and with deeper wells, the effective channel width can be increased by 4-8 times. FIG. 7 shows a cutaway view of the cell 112 similar to FIG. 5, but showing current paths 220 including horizontal wall paths 222 and vertical wall paths 224. The horizontal wall paths 222 collectively provide current carrying capacity roughly equivalent to conventional devices, while the vertical wall paths 224 provide additional current paths made possible by the embodiment described herein. The wider channel, coupled with the possibly higher mobility on the sidewall planes, will reduce the channel resistance 3-4 times (or 6-8 times with deeper wells). Because the trenches 202, 204, and so forth extend under the source contacts 130 as illustrated in FIGS. 3 and 6, the source contact area is similarly increased, reducing the source resistance.

Figure 8:
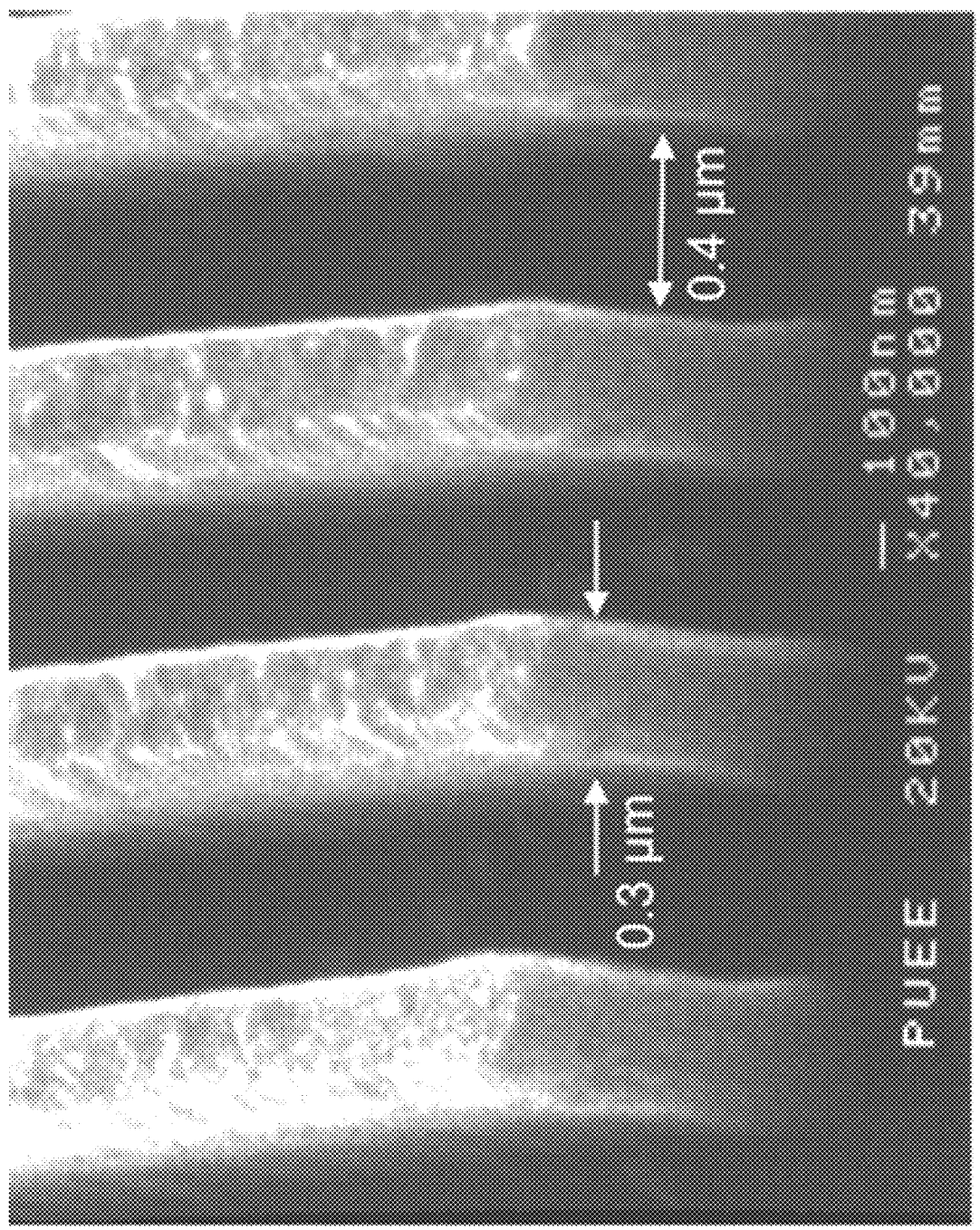
FIG. 8 shows a photograph of vertical trenches which may be used as the trenches in the device of FIG. 3.

FIG. 8 shows a photograph of a vertical trenches which may be used as the trenches 202, 204 and so forth of FIGS. 3-6. The trenches of FIG. 8 are up to 2.5 µm deep, with sub-micron period. However, these depths and periodicity are provided for exemplary reasons and not intended to be limiting.

Figure 9:
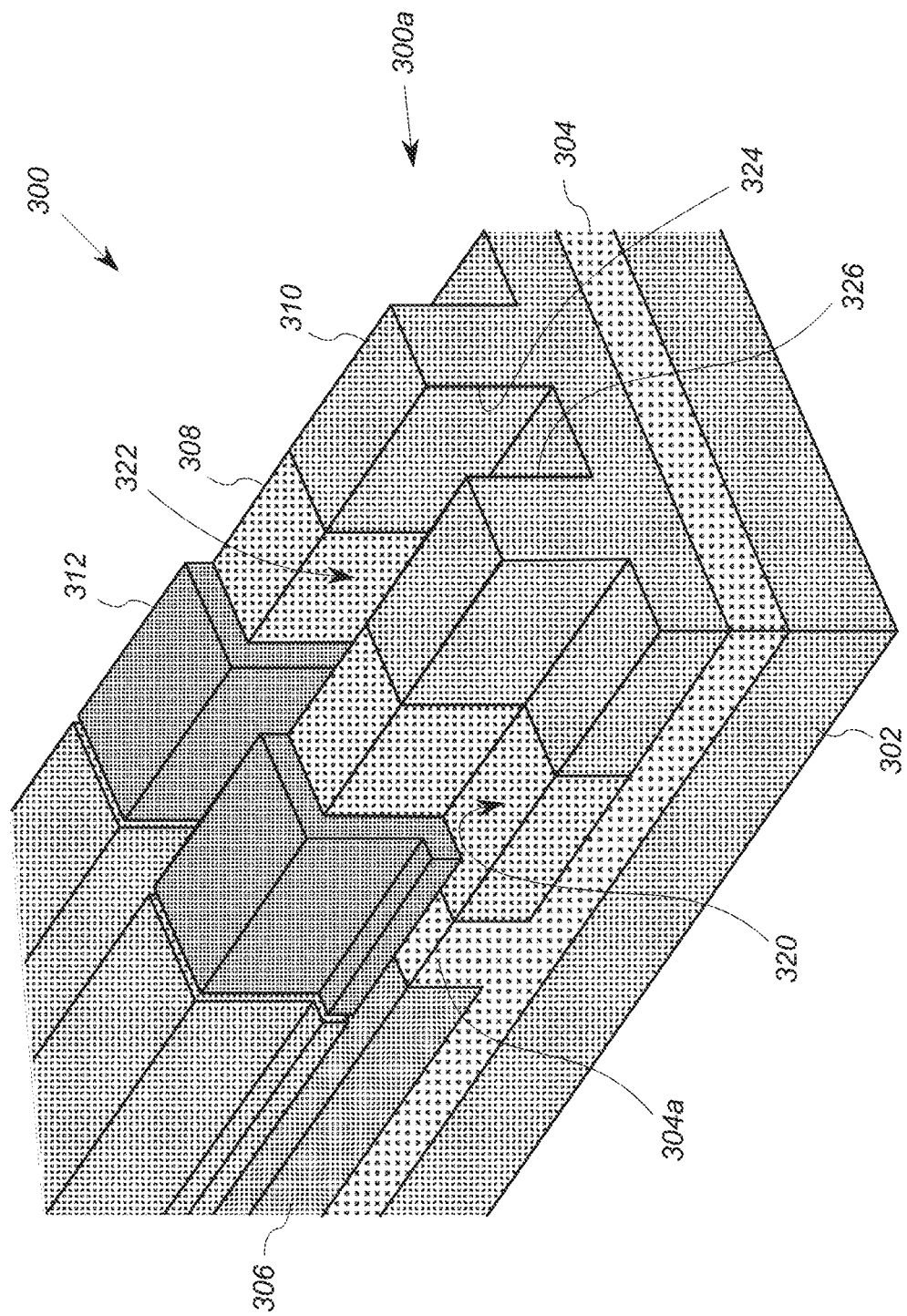
FIG. 9 shows a fragmentary, cutaway view of an alternative device forming a lateral MOSFET implementing an embodiment of invention.

FIG. 9 shows a fragmentary, cutaway view of an alternative device 300 forming a lateral MOSFET, the device 300 having a top surface 300a. The alternative device 300 includes at least the following elements: a substrate 302, a base region 304 disposed over the substrate 302, a source region 306, a drift region 308, a drain region 310, a gate region 312, and a source contact 314. In this embodiment, the drain region 310, the drift region 308 and the source region 306 all have the same first dopant type, and the base region 304 has a second dopant type. In this embodiment, the first dopant type is an N type dopant, and the second dopant type is a P type dopant. However, in other embodiments, the dopant types may be reversed.

In this embodiment, the base region 304 is a P-doped region disposed over the substrate 302, and which includes an upward extending vertical portion 304a that extends to or near the top surface 300a.

The drain region 310 in this embodiment is highly doped (N+) and is disposed over a portion of the base region 304 and terminates at or near the top surface 300a. The drift region 308 is a lightly doped (N−) region disposed above the P-base region 304. The drift region 308 also abuts the drain region 310 on one side and may also extend partially under the drain region 310, and the vertical portion 304a of the P-base region 304 on the other side. The source region 306 is a relatively highly doped (N+) region that is disposed over a portion of the base region 304 and abuts the opposite side of the vertical portion 304a of the base region 304. Thus, the vertical portion 304a of the base region 304 abuts the source 306 on one side, and the drift region 308 on the other.

The gate region 312 includes a gate conductor and a gate insulator having the general structure of the gate conductor 132 and gate insulator 134 of FIGS. 3-6. The gate conductor of the gate region 312 extends over the vertical portion 304a of the base region 304, over a portion of the source region 306, and over a portion of the drift region 308.

Similar to the embodiment of FIGS. 3-6, the device 300 of FIG. 9 also includes trenches 320, 322, and so forth. The trench 322 includes vertical walls 324, 326 and a horizontal bottom wall 328, and extends at least from a portion of the source region 306, the vertical portion 304a, and into the drift region 308, and possibly also extending into the drain region 310. The other trenches 320 and so forth have a substantially similar structure. The trenches 320, 322 may suitably run parallel to each other. The operation of the device 300 is similar to a conventional lateral power MOS- FET, except the additional horizontal current paths are created by the vertical walls 324, 326 of trenches 320, 322.

As with the DMOSFET, the lateral MOSFET of FIG. 9 may be doped with either dopant type (i.e., P or N), or made semi-insulating.

Thus, the devices 110 and 300 provide enhanced surface area at the interface along which current flows under the influence of a gate voltage (or other field inducing feature of the device). In the devices above, the interface is the area under the gates 132, 312 and at or near the surface of the base regions 126, 304, source regions 128, 306 and/or drift regions 124, 308. In general, the trenches or other features can be implemented to increase the surface area of an interface along which the current flow can be modulated by a perpendicular electric field. As a result of the trench or other feature, surface area is increased because at least a portion of the interface lies on a plane substantially perpendicular to the plane of the substrate. The interface is configured such that at least a portion of the current flow along the portion of the interface that lies on a plane substantially perpendicular to the plane of the substrate is in a direction substantially parallel to the plane of the substrate. The improvement in the on-resistance per surface area can be realized in other devices, including other MOS-based power devices such as IGBTs, MCTs, or MESFET-based or JFET-based devices. In other words, the same trenches or other features creating the portion of the interface that is perpendicular to the area of the substrate can be carried out in a conductor-semiconductor interface (e.g., a MESFET), or a semiconductor-semiconductor interface (e.g., a JFET), in addition to the conductor-insulator-semiconductor interface of MOS-based devices.

Figure 1:
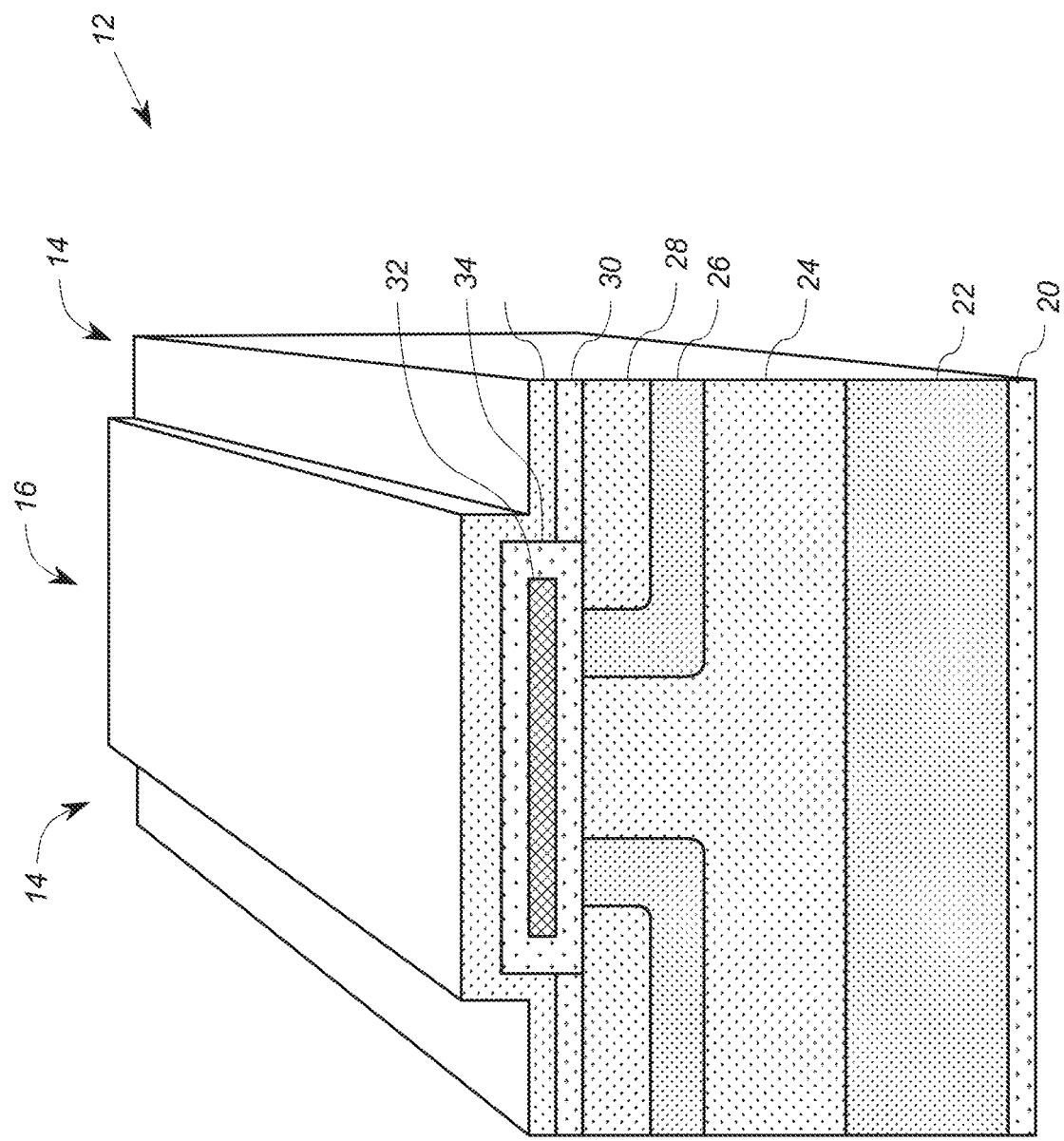
FIG. 1 shows a schematic cross-sectional view of a cell of a stripe-geometry DMOSFET according to the prior art.
Figure 10A:
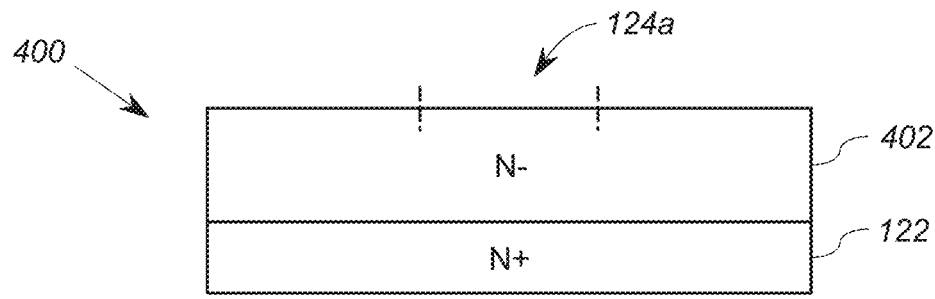
FIG. 10A shows a substrate having the semiconductor substrate and an N− region.

FIGS. 10A through 10I1 show an exemplary process for fabricating the embodiment of the device 300 shown in FIGS. 3-6. As shown in FIG. 10A, a substrate 400 having the semiconductor substrate 122 and an N− region 402 is provided. The N− region 402 will form, among other things, the drift region 124. (See also FIGS. 3 and 4). Other layers, such as an n-type current spreading layer above the drift region, may also be included, but are not shown here for clarity.

Figure 10B:
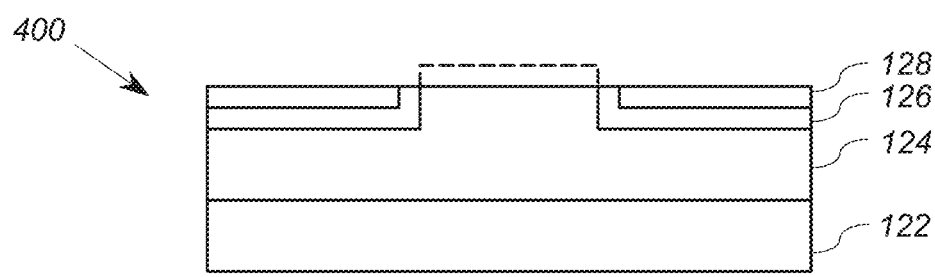
FIG. 10B shows the substrate of FIG. 10A with P-base regions and source regions formed.

Thereafter, as shown in FIG. 10B the P-base regions 126 and source regions 128 are formed using known implantation techniques. For example, the base region 126 may be formed by masking the central area 124a of the N− region 402, and then implanting P-type ions into the device. Thereafter, a second mask can be applied to the allow implantation of the N-type ions to form the source region 128 using known techniques. Alternatively, a self-aligning process may be used to form the base regions 126 and source regions 128 such as those discussed in U.S. Pat. Nos. 7,498,633 and 8,476,697. Other implants, such as, for example, a counter-doped channel or threshold-adjust implant may also be performed at this point, using procedures familiar to those skilled in the art.

Figure 10C:
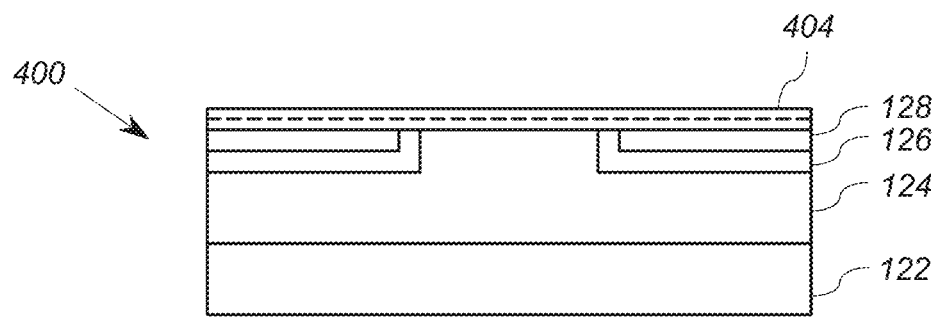
FIG. 10C shows the substrate of FIG. 10B with a carbon cap is formed over the top surface.

Following the implantation steps discussed above, the implanted dopants are activated in an annealing process. To this end, a carbon cap 404 is formed over the top surface of the device 400, as shown in FIG. 10C. The carbon cap 404 may suitably be formed of photoresist. For a device 400 formed of an SiC substrate, the annealing step can be a high temperature anneal of 1600° C. for 30 minutes. The annealing step recovers the crystal structure from the damage done from the ion implantation process, and allows the dopants to take substitutional positions the lattice. The carbon cap 404 is thereafter removed in a conventional manner.

Figure 10D:
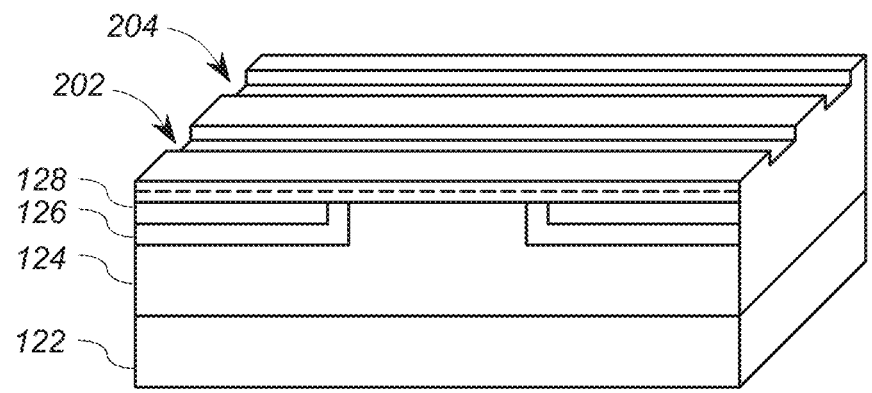
FIG. 10D shows the substrate of FIG. 10C with trenches formed therein.

After the annealing step, the trenches 202, 204 are formed as shown in FIG. 10D. The trenches 202, 204 may suitably be formed by reactive ion etching, which creates good vertical walls. In an exemplary embodiment, SF6 may be used as the gas in the reactive ion etching process.

Figure 10E:
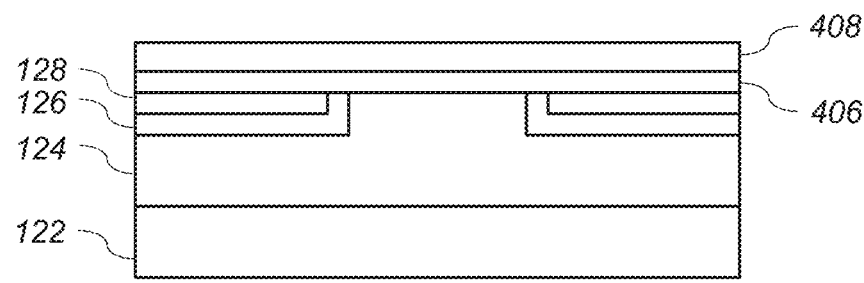
FIG. 10E shows the substrate of FIG. 10D with a thin oxide layer and polysilicon layer formed therein.

After etching the trenches 202, 204, a thin oxide layer 406 is formed on top surface 110b of the device 400 using thermal oxidation or low-temperature chemical vapor deposition (CVD). The thermal oxidation may suitably occur in a wet environment or a dry environment. After oxidation, a polysilicon layer 408 is provided on the surface 110b over the oxide layer 406. To this end, a conventional chemical vapor deposition process is employed (600° C. silane CVD). The polysilicon layer 408 is then doped to increase the conductivity. The dopant may suitably be phosphorus. The result of these processes are shown in FIG. 10E. It is noted that because FIG. 10E is a front cutaway view, the trenches are not visible. However, the oxide layer 406 and the polysilicon layer 408 are conformal with the trenches 202, 204, and thus cover the walls thereof.

Figure 10F:
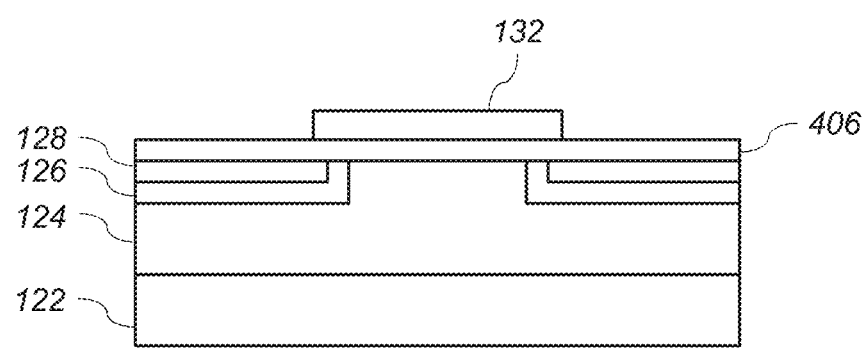
FIG. 10F shows the substrate of FIG. 10E with a single strip of the polysilicon layer that forms the gate conductor.

Thereafter, the polysilicon layer 408 is patterned into strips that form the gate conductors 132 of the gate fingers 116. To pattern the gate conductors 132, the polysilicon layer 408 is masked such that the unexposed portions coincide with the location of the gate conductor 132 and/or the gate fingers 116. The exposed portions are then etched away and the mask removed. The result of this step is shown in FIG. 10F, which shows a single strip of the polysilicon layer 408 that forms the gate conductor 132.

Figure 10G:
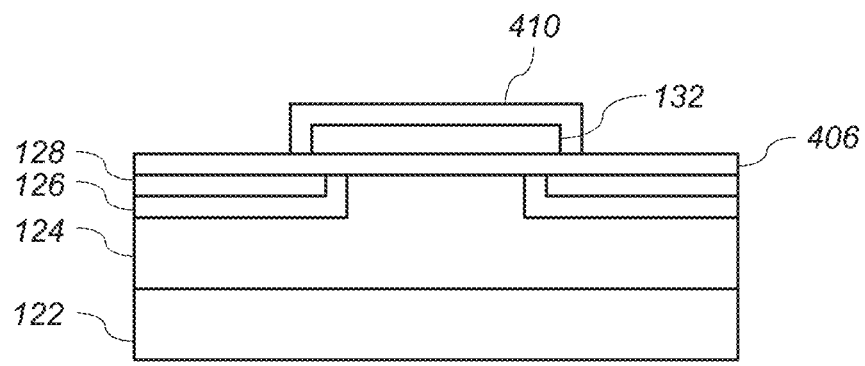
FIG. 10G shows the substrate of FIG. 10F with an oxide layer formed on the top and sides of the polysilicon gate conductor.

An oxide layer 410 is then formed on the top and sides of the polysilicon gate conductor 132. The oxide layer 410 only covers the sides and top of each polysilicon gate conductor 132, and not the oxide layer 406 therebetween. The oxide layer 410 is formed to be thicker than the oxide layer 406. The result of this step is shown in FIG. 10G.

Figure 10H:
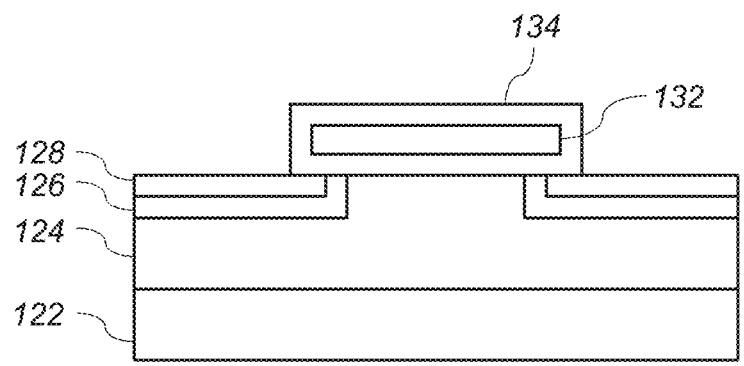

After the formation of the oxide layer 410, a light etching takes place to remove the oxide layer 406, but not all of the oxide layer 410. The etching may suitably be an HF etch. Thus, the source layer 128 has an exposed upper surface, and the gate region (gate conductor 132 and gate insulator 134) is completed. The result of this step is shown in FIG. 10H.

The source contact 130 is then formed using metal evaporation or sputtering, followed by a suitable high-temperature anneal to establish a low-resistance ohmic contact. The top metal contact 136 and the drain contact 120 may then be deposited using conventional means. The result of this step is the device 100 of FIG. 3.

It will be appreciated that the above fabrication steps are merely exemplary, and that those of ordinary skill in the art may readily devise their own modifications to suit specific needs.

The present disclosure presents a novel three-dimensional-gate (3G) arrangement for a variety of switching devices including, but not limited to, double-diffused or double-implanted MOSFETs (DMOSFETs), lateral MOSFETs, and insulated-gate bipolar transistors (IGBTs); in which vertical trenches are formed perpendicular to the gate and source fingers, as shown in FIGS. 3-6, and 9. These trenches expose sidewall faces as well as horizontal faces, without increasing cell area. Conformal gate oxides and polysilicon gates are formed over the trenches so that the MOSFET channel includes both horizontal and vertical surfaces, as shown in FIG. 6. This arrangement increases the effective channel width by 2-3 times (and with deeper wells, the effective channel width can be increased by 4-8 times). The additional current paths 224 made possible by the embodiment of FIGS. 3-6 are illustrated in FIG. 7.

While not shown, the same three-dimensional-gate arrangement can be applied to IGBT devices. In such a device, the substrate can be described as being doped with a first dopant type of a first high concentration, e.g., a P+ substrate. The collector of the IGBT is coupled to the substrate. The drift region can be described as being doped with a second dopant of a first concentration, e.g., an N− drift region. A base implant can be described as an implant doped with the first dopant type of a second high concentration, e.g., a P+ base. The emitter region can be described as being doped with the second dopant of second high concentration, e.g., an N+ emitter. It is understood that these doping polarities may also be inverted, i.e. the N-type regions changed to P-type and the P-type regions changed to N-type.

It should also be noted that while polysilicon is described as gate material herein, other material are possible, such as metals, and in particular, aluminum, molybdenum, or a bi-layer of gold over titanium.

The above illustrative embodiments employ a linear stripe geometry surface pattern. In other words, they employ parallel gate fingers 112 and source fingers 114 similar to those shown in the array of FIG. 2, with trenches running perpendicular to the fingers 112, 114. (See, e.g. FIG. 3). However, the three-dimensional gate/interface structure can also be applied to other surface patterns, such as cellular surface patterns. In a cellular surface pattern, the individual MOSFETs (or IGBTs) are not formed as linear stripes, but instead in repeated closed-geometry patterns such as hexagons, squares, or other closed polygons, similar to "islands". These closed-geometry patterns are distributed in a regular two-dimensional array across the top surface of the structure.

Figures 11A, 11B:
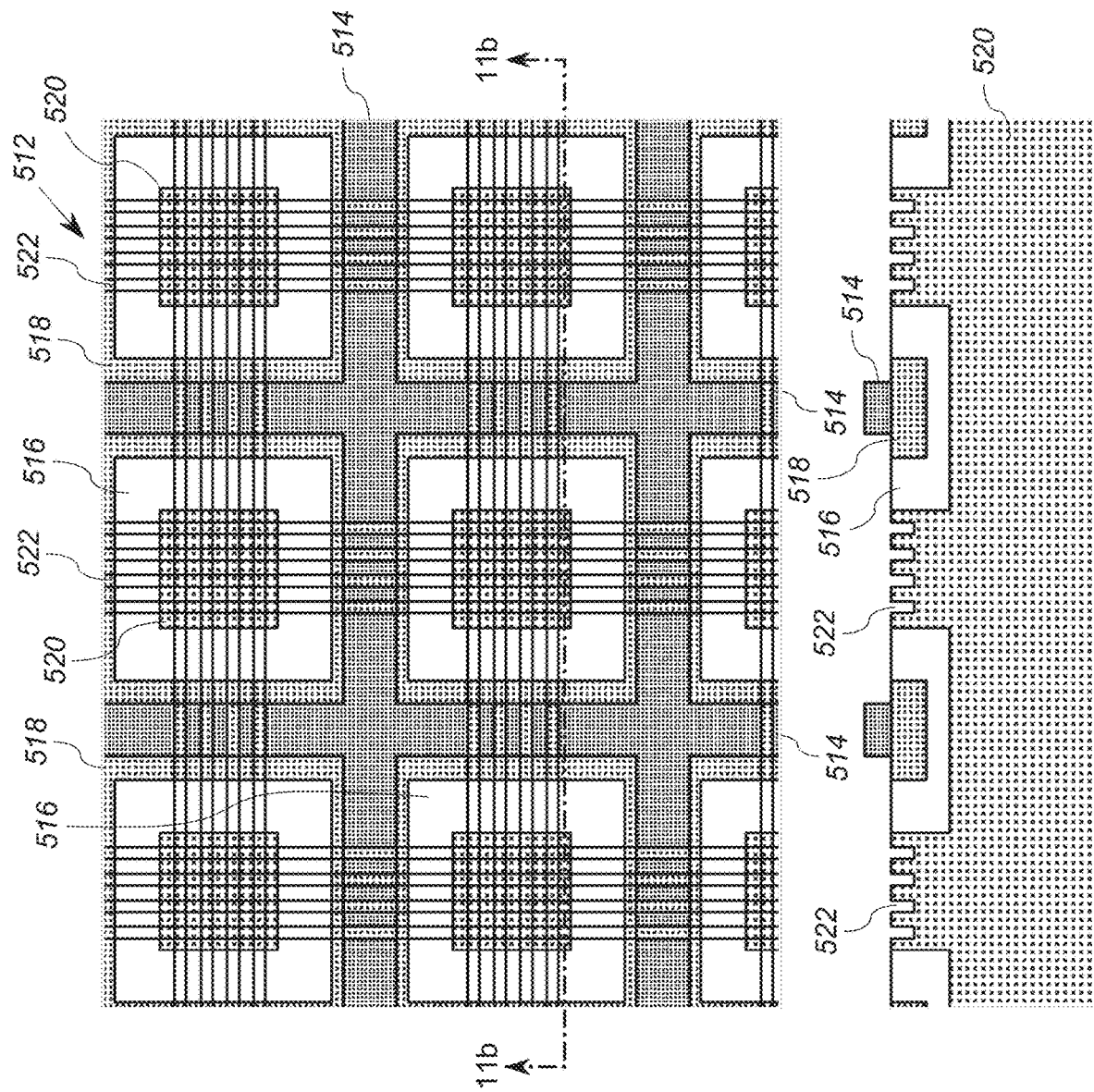
FIG. 11A shows a top plan view of a device employing a cellular surface layout of repeating square devices.
FIG. 11B shows and an orthogonal slice of the cellular surface layout FIG. 11A.

FIGS. 11A and 11B show, respectively, a top plan view and an orthogonal slice of such a device 510 employing a cellular surface layout of repeating square devices 512. The devices include a metallic source contact 514, p-wells forming base regions 516 in a grid pattern, N-doped source regions 518 formed within the P-base regions 516, and below the source contact 514. The drift region 520 extends below the P-base regions 516, and between adjacent P-base regions 516. The structure of the semiconductor substrate and drain contact, not shown, may suitably be the same as that of the device 110 of FIG. 3. The semiconductor substrate in this embodiment extends downward from the drift region 520. The gate structures, not shown, but which may take any suitable form, are disposed above the P-base regions 516, a portion of the source regions 518 and a portion of the drift regions 520.

In accordance with this embodiment of the invention, the trenches 522 extend along the top surface such that within each individual closed-geometry cell, the trenches 522 are oriented substantially perpendicular to the edges of the source regions 518 and the base regions 516. The trenches 522 extend in a grid pattern, as opposed to merely in stripes, as per FIG. 3.

Thus, the trenches 522, like those of FIG. 3 and FIGS. 11A and 11B, form additional surface area at the interface between the gate structure and the semiconductor regions 516, 518 and 520. Other layouts of trenches can accommodate different cellular surface layouts, such as those having hexagonal devices.

Those skilled in the art will recognize that numerous modifications can be made to the specific implementations described above. The implementations should not be limited to the particular embodiments described. Other implementations may be possible.

The invention claimed is:

1. A semiconductor device, comprising:
at least a first lateral MOSFET formed on a semiconductor substrate, the first lateral MOSFET having an interface defined by a plurality of trenches along which the current flow can be modulated by a perpendicular electric field, wherein at least a portion of the interface lies on a plane substantially perpendicular to the plane of the substrate, the interface configured such that at least a portion of the current flow along the portion of the interface that lies on a plane substantially perpendicular to the plane of the substrate is in a direction substantially parallel to the plane of the substrate; and
wherein a base region of the first lateral MOSFET is disposed below the plurality of trenches and has a substantially flat and coplanar upper surface portions disposed under drain and source regions of the first lateral MOSFET.

2. The semiconductor device of claim 1, wherein said interface is a conductor-insulator-semiconductor interface.

3. The semiconductor device of claim 1 wherein the semiconductor substrate comprises an SiC substrate.

4. The semiconductor device of claim 1, wherein a drift region of the first lateral MOSFET forms a portion of a plurality of vertical walls of one of more of the plurality of trenches.

5. The semiconductor device of claim 4 wherein the base region has a further substantially flat upper surface portion disposed under the drift region, and wherein the further substantially flat upper surface portion is substantially coplanar with the substantially flat and coplanar upper surface portions disposed under drain and source regions.

6. A semiconductor device, comprising:
at least a first lateral MOSFET formed on a semiconductor substrate, the first lateral MOSFET having an interface defined by a plurality of trenches along which the current flow can be modulated by a perpendicular electric field, wherein at least a portion of the interface lies on a plane substantially perpendicular to the plane of the substrate, the interface configured such that at least a portion of the current flow along the portion of the interface that lies on a plane substantially perpendicular to the plane of the substrate is in a direction substantially parallel to the plane of the substrate; and
wherein a base region of the first lateral MOSFET abuts a drift region, a source region, and a drain region of the first lateral MOSFET.

7. The semiconductor device of claim 6, wherein the source region and the drain region form respective portions of the plurality of vertical walls of the one or more of the plurality of trenches.

8. The semiconductor device of claim 7, wherein the base region extends below the source region and the drain region.

9. The semiconductor device of claim 8, wherein the base region further extends between the source region and the drift region.

10. The semiconductor device of claim 7, wherein the base region further extends between the source region and the drift region.

11. The semiconductor device of claim 6, wherein said interface is a conductor-insulator-semiconductor interface.

12. A semiconductor device, comprising:
at least a first lateral MOSFET formed on a semiconductor substrate, the first lateral MOSFET having an interface defined by a plurality of trenches along which the current flow can be modulated by a perpendicular electric field, wherein at least a portion of the interface lies on a plane substantially perpendicular to the plane of the substrate, the interface configured such that at least a portion of the current flow along the portion of the interface that lies on a plane substantially perpendicular to the plane of the substrate is in a direction substantially parallel to the plane of the substrate; and wherein a base region of the first lateral MOSFET abuts a drift region, a source region, and a drain region of the first lateral MOSFET.

13. The semiconductor device of claim 12, wherein the source region and the drain region form respective portions of the plurality of vertical walls of one or more of the plurality of trenches.

14. The semiconductor device of claim 13, wherein the base region extends below the source region and the drain region.

15. The semiconductor device of claim 13, wherein the base region further extends between the source region and the drift region.

* * * * *